United States Patent [19]

Kaji et al.

[11] 3,997,378
[45] Dec. 14, 1976

[54] METHOD OF MANUFACTURING A SEMICONDUCTOR DEVICE UTILIZING MONOCRYSTALLINE-POLYCRYSTALLINE GROWTH

[75] Inventors: Tadao Kaji, Kokubunji; Tsuneaki Kamei, Mitaka; Keiji Miyamoto, Hinode, all of Japan

[73] Assignee: Hitachi, Ltd., Japan

[22] Filed: Oct. 17, 1975

[21] Appl. No.: 623,476

[30] Foreign Application Priority Data
Oct. 18, 1974 Japan ............................ 49-119357

[52] U.S. Cl. .................................. 148/174; 29/578; 29/579; 29/580; 148/175; 148/187; 156/3; 156/13; 156/17; 156/612; 357/40; 357/48; 357/49; 357/50; 357/59; 427/88; 427/259; 427/272

[51] Int. Cl.² .................. H01L 21/20; H01L 21/76

[58] Field of Search .................. 148/174, 175, 187; 29/578, 580; 156/3, 11, 13, 17, 612; 357/49, 50, 48, 40, 59; 427/88, 259, 272

[56] References Cited
UNITED STATES PATENTS

| | | | |
|---|---|---|---|
| 3,135,638 | 6/1964 | Cheney et al. ....................... | 156/11 |
| 3,386,865 | 6/1968 | Doo ................................... | 148/175 |
| 3,447,984 | 6/1969 | Castrucci et al. ................. | 156/17 X |
| 3,500,139 | 3/1970 | Frouin et al. ..................... | 357/48 X |
| 3,537,925 | 11/1970 | Chen ................................. | 156/3 X |
| 3,607,466 | 9/1971 | Miyazaki ............................ | 148/175 |
| 3,617,822 | 11/1971 | Kobayashi ........................ | 357/59 X |
| 3,861,968 | 1/1975 | Magdo et al. ...................... | 148/175 |
| 3,947,299 | 3/1976 | Weijland et al. .................. | 148/187 |
| 3,954,522 | 5/1976 | Roberson .......................... | 148/175 |

*Primary Examiner*—L. Dewayne Rutledge
*Assistant Examiner*—W. G. Saba
*Attorney, Agent, or Firm*—Craig & Antonelli

[57] ABSTRACT

In the manufacture of a semiconductor device, when an epitaxially-grown layer is formed on a semiconductor substrate partially formed with an oxide, a polycrystalline layer is formed on the oxide; the polycrystalline part is used as an isolation region for elements to be formed in the epitaxially-grown layer. The oxide for growing the polycrystalline layer is buried and formed in the semiconductor substrate at a depth at which a breakdown voltage between the elements is attained, whereby the width of the isolation region can be made small, so as to increase the density of integration of the semiconductor device.

6 Claims, 9 Drawing Figures

METHOD OF MANUFACTURING A SEMICONDUCTOR DEVICE UTILIZING MONOCRYSTALLINE-POLYCRYSTALLINE GROWTH

FIELD OF THE INVENTION

The present invention relates to a semiconductor device, and, more particularly, to a technique for isolating elements in an integrated circuit from one another.

DESCRIPTION OF THE PRIOR ART

Figure 1:
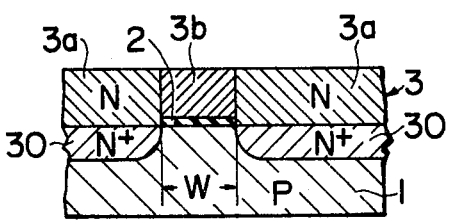
FIG. 1 is a schematic sectional view for explaining a prior-art isolation technique.

In manufacturing a semiconductor integrated circuit, an isolation technique for electrically isolating circuit elements is indispensable. An example of an isolation technique is illustrated in FIG. 1. A noncrystalline layer such as silicon oxide ($SiO_2$) (the nucleus of growth for a polycrystalline layer) 2 is formed on selected areas of a surface of a P-type silicon (Si) substrate 1 which includes therein an $N^+$-layer 30 having an N-type impurity having a high impurity concentration. An epitaxially-grown layer ($E_p$ layer) 3 is formed on the resulatant substrate.

In this case, monocrystalline silicon 3a is formed on the upper surface of the substrate other than the areas of the growth layer such as $SiO_2$, while polycrystalline silicon 3b is formed on the areas of the layer 2. Since the polycrystalline silicon 3b has an insulating property, it is utilized for an isolation region among a plurality of regions of the monocrystalline silicon 3a in which the respective circuit elements are formed. (Such an isolation technique is described in, for example, Japanese Patent Application Publication No. 13095/1969 or No. 23498/1970.).

Where the polycrystalline silicon 3b is employed as the isolation region, the width W of the polycrystalline silicon 3b has heretofore been set at $10\mu$ or so. Although the size is partly attributed to the restriction of the pattern working process such as a photoetching process, an essential reason is that the maximum load voltage between the elements formed in the single crystal silicon 3a, in other words, the applied voltage between the P-type substrate 1 and the region 3a formed with the element therein, must be taken into account. Due to the dimensions, the isolation region made of the polycrystalline silicon 3b occupies a considerable area and hinders the enhancement of the density of the integration of the device.

SUMMARY OF THE INVENTION

It is, accordingly, an object of this invention to decrease the width W of the isolation region, in order to increase the density of integration of the overall device.

The construction of this invention for accomplishing the object is characterized in that, considering the spread of a depletion layer due to the maximum load voltage between the elements, the growth nucleus for the polycrystalline layer is formed so as to be deep in the direction of the thickness of the substrate.

DETAILED DESCRIPTION OF THE INVENTION

Hereunder, the manufacture of a semiconductor device according to this invention will be described with reference to FIGS. 2A to 2D.

Figure 2A:
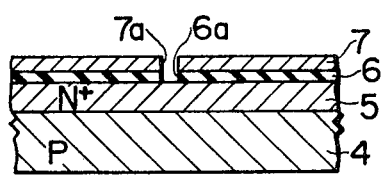
FIGS. 2A to 2D are schematic sectional views which show an embodiment of this invention in the order of the processing steps.

First, as illustrated in FIG. 2A, an $N^+$ diffused layer 5 having an N-type impurity at a high impurity concentration is formed over the entire area of a P-type silicon (Si) substrate 4 by a well-known diffusion technique. Thereafter, a silicon oxide ($SiO_2$) layer 6 and an etching mask layer 7 for the $SiO_2$) layer 6 and an etching mask layer 7 for the $SiO_2$6 are formed on the resultant substrate. The process for forming the etching mask will be later described. By etching the $SiO_2$6 through a fine aperture 7a provided in the mask layer 7, a fine aperture 6a similar to the fine aperture 7a is formed. The fine aperture 6a (7a) is provided at a position corresponding to that portion on the Si substrate 4 in which an isolation region is to be formed. In addition, the width of the fine aperture is set at about 0.1 to 2 $\mu$m, and it must be at least smaller than the depth of an etching groove 8 which is to be formed by the next step.

Figure 2B:
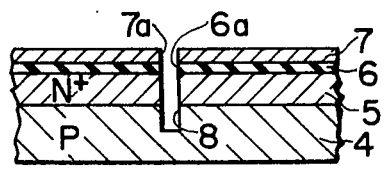

Subsequently, as illustrated in FIG. 2B the etching groove 8 is formed by etching the substrate 4 through the fine apertures 6a and 7a formed on the Si substrate. In this case, the etching groove 8 is made so deep that it penetrates through the $N^+$ diffused layer 5 and that the breakdown voltage between elements which are formed in an $E_p$ layer to be described later is high (for example, 2 to 4 $\mu$m deep). An etching process having a high directivity such as reverse sputtering and ion etching should desirably be employed.

Figure 2C:
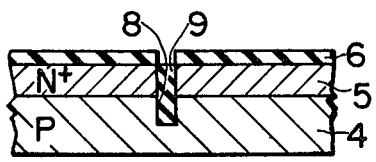

Thereafter, as illustrated in FIG. 2C, the mask layer 7 is etched and removed, whereupon the Si substrate 4 is subjected to a thermal oxidation treatment by heating it at a high temperature of e.g., 1000° C. Thus, the etching groove 8 is filled up with $SiO_2$ (the growth nucleus of a polycrystalline layer) 9. In this case, the etching groove 8 is gradually filled up with $SiO_2$ where $SiO_2$ parts produced on both sides of the groove by the thermal oxidation abut each other. Accordingly, the heat treatment for the formation of the $SiO_2$9 is completed in a short time.

Figure 2D:
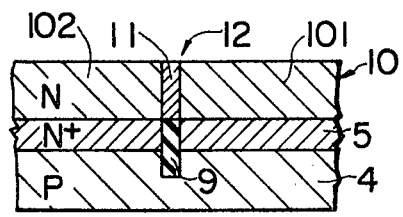

Subsequently, as illustrated in FIG. 2D, the $SiO_2$ layer 6 formed on the Si substrate 4 is removed by a well-known etching technique, whereupon an N-type epitaxial layer 10 is grown on the substrate 4 by a well-known chemical vapor deposition technique. Thus, as in the previous description, polycrystalline silicon layer 11 is formed at a part on the $SiO_2$ layer 9. Therefore, an isolation region 12 (9, 11) is finished at the same time as the epitaxial growth.

The semiconductor device thus formed is used for the fabrication of an integrated circuit. In regions 101 and 102 of the expitaxial layer 10 separated by the polycrystalline silicon 11, circuit elements such as transistors and resistors are respectively formed. As a rule, a single circuit element is formed in each of the regions 101 and 102. Even when a voltage is applied to the regions 101 and 102 in order to operate the circuit elements, depletion layers which extend from the P-N junctions between the P-type substrate 4 and the $N^+$-type layer 5 into the P-type substrate 4 by the voltage do not extend beyond the depth of the $SiO_2$ layer 9 buried in the substrate 4, and hence, the regions 101 and 102 are never interconnected by the depletion layers. That is, the regions 101 and 102 never undergo the punch-through effect via the substrate 4.

It is important that the depth of the SiO$_2$ layer 9 to be formed in the P-type substrate 4 is larger than the depth of the depletion layer which is to extend in the P-type substrate 4 by the maximum load voltage to be applied between the element forming region 101 or 102 and the substrate 4.

Although, in the foregoing embodiment, the N$^+$ diffused layer 5 is formed previous to the polycrystalline growing nucleus 9, the former may be formed after the formation of the latter. The N$^+$ diffused layer 5 may be formed by an epitaxial growth technique, instead of diffusion techniques.

Referring now to FIGS. 3A to 3D,, description will be made of the process for forming the mask layer 7 having the fine aperture 7a.

Figure 3A:
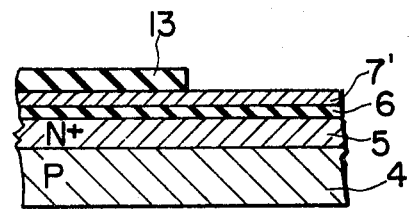
FIGS. 3A to 3D are schematic sectional views which show an example of a process for forming an etching mask.
Figure 3B:
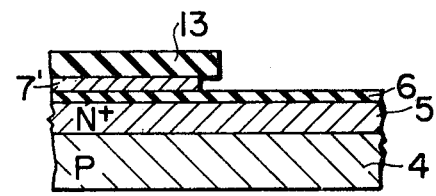
Figure 3C:
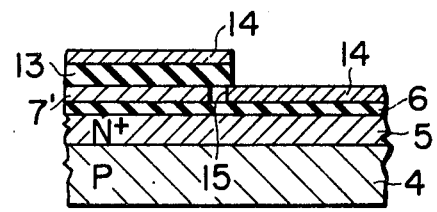

First, as is illustrated in FIG. 3A, after forming the N$^+$ diffused layer 5 and the thermal oxidation SiO$_2$ layer 6 on the Si substrate 4, a chromium (Cr) layer 7' for forming the mask is formed on the resultant substrate, and further, a partial polyimide resin layer 13 for removal is formed on the Cr layer. Subsequently, as illustrated in FIG. 3B, the Cr layer 7' is selectively etched and removed by employing the polyimide resin layer 13 of the uppermost layer as an etching mask. In this case, the amount of side etching is set at about 1μm, which is larger than the amount to which chromium is extended beneath the mask 13 by evaporation at the next evaporation step. Next, as illustrated in FIG. 3C, a layer of Cr 14 is evaporated on the entire area of the upper side of the Si substrate 4 with the etching treatment of the Cr layer 7' completed. The evaporated layer 14 is hardly deposited on the side surface part of the polyimide resin layer 13 because the polyimide resin layer 13 is formed thickly for removal purposes. As a consequence, a discontinuous step arises between the Cr part deposited on the layer 13 and the Cr part deposited on the SiO$_2$ layer 6. Moreover, the amount of side etching of the Cr 7' under the polyimide resin layer 13 is set to be larger than the extending amount of the evaporated Cr 14, so that a fine gap 15 is formed between the Cr 14 and the Cr 7' on the SiO$_2$ layer 6.

Figure 3D:
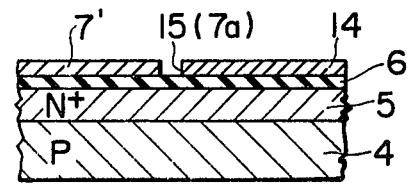

Thereafter, as illustrated in FIG. 3D, that part of the evaporated Cr 14 which overlies the polyimide resin layer 13 is removed simultaneously with the etching and removal of the layer 13. Then, the Cr mask layer 7 composed of the parts 7' and 14 and having the fine aperture 7a (15) is completed on the SiO$_2$ layer 6. Although the Cr mask layer 7 can also be formed by a minute pattern working technique utilizing an electron beam, a laser beam, or the like, respective pellets on an Si wafer can be processed at the same time in accordance with the foregoing pattern working technique utilizing the removal method.

As is set forth above, according to the method of this invention for manufacturing a semiconductor device, the growth nucleus for the polycrystalline layer is formed to be deep in the direction of the thickness of the substrate in consideration of the spread of the depletion layer due to the maximum load voltage between the elements, and hence, its width need not be made so large as in the prior art. As the result, the occupying area of the polycrystal to be grown on the nucleus of growth or the isolation region becomes small, and the density of integration is enhanced.

We claim:

1. A method of manufacturing a semiconductor device comprising the steps of:
   a. selectively removing semiconductor material from the principal surface of a semiconductor substrate made up of at least one semiconductor layer of first conductivity type and the conductivity type of the semiconductor material of the substrate therebeneath is a second conductivity type, opposite said first conductivity type, so that a PN junction is formed between said one semiconductor layer and the semiconductor material of the substrate therebeneath, to form a groove in said substrate which extends to a prescribed depth in said substrate, said groove extending beyond said PN junction;
   b. filling said groove with a first layer of insulator material; and
   c. forming a second semiconductor layer over the entire surface of said one semiconductor layer and said insulator material filling said groove, so as to form polycrystalline semiconductor material on said insulator material and monocrystalline semiconductor material on the adjoining said one semiconductor layer.

2. A method of manufacturing a semiconductor device according to claim 1 wherein said one semiconductor layer is formed by introducing impurities of a prescribed conductivity type into said principal surface of said substrate, subsequent to the filling of said first layer of insulator material in said groove, to form a first semiconductor layer to a depth less than that of said groove and defining with the semiconductor material of said substrate a PN junction the depth of which from said principal surface is less than the depth of said groove.

3. A method of manufacturing a semiconductor device according to claim 1, wherein step (b) comprises the step of oxidizing the semiconductor material of said substrate to form an oxide insulator layer in said groove.

4. A method of manufacturing a semiconductor device according to claim 1, wherein said step (a) comprises the steps of
   a1. forming an insulating film on the principal surface of said substrate,
   a2. forming a metallic layer on said insulating film,
   a3. selectively forming a mask on said metallic layer,
   a4. applying an etchant to the selectively formed mask and metallic layer to side etch said metallic layer beneath an edge of said mask,
   a5. forming further metallic layer on part of the exposed insulator film so as to leave a gap between areas of metallic material on said insulator film beneath said mask,
   a6. removing said mask to expose said gap, and
   a7. selectively etching said insulator film and said substrate by way of the gap in the metallic material in the surface of said insulator film.

5. A method of manufacturing a semiconductor device according to claim 4, wherein each of said metallic layers is a layer of chromium.

6. A method of manufacturing a semiconductor device according to claim 5, wherein said mask is made of polyimide resin.

* * * * *